United States Patent [19]
Hsu et al.

[11] Patent Number: 5,886,356
[45] Date of Patent: Mar. 23, 1999

[54] AUTOMATIC SUPERVISION SYSTEM ON THE ION BEAM MAP FOR ION IMPLANTATION PROCESS

[75] Inventors: Pau-Lo Hsu, Hsinchu; Li-Cheng Shen, Taichung; Chin-Shien Yang; Chi-Shun Hou, both of Hsinchu Hsien, all of Taiwan

[73] Assignee: Taiwan Semiconductor Manufacturing Co., Ltd., Hsinchu, Taiwan

[21] Appl. No.: 820,461

[22] Filed: Mar. 17, 1997

[51] Int. Cl.$^6$ .................................................... H01J 37/304
[52] U.S. Cl. ...................................... 250/492.21; 250/397
[58] Field of Search .................................. 250/398, 397, 250/492.21

[56] References Cited

U.S. PATENT DOCUMENTS

| | | | |
|---|---|---|---|
| 4,421,988 | 12/1983 | Robertson et al. | 250/398 |
| 4,633,138 | 12/1986 | Tokiguchi et al. | 250/492.21 |
| 4,736,107 | 4/1988 | Myron | 250/492.21 |
| 4,761,559 | 8/1988 | Myron | 250/398 |
| 5,278,420 | 1/1994 | Sugiyama | 250/492.21 |

*Primary Examiner*—Bruce Anderson
*Attorney, Agent, or Firm*—Christensen O'Connor Johnson & Kindness PLLC

[57] ABSTRACT

An automatic supervision system using an ion beam map generated by an ion implantation machine during an ion implantation process a feature extraction circuit and a data converter. The feature extraction circuit receives a beam current signal and a display blanking signal from the ion implantation machine, and extract features of the ion beam map. The data converter is coupled to the feature extraction circuit and converts the features into indexes indicative of the alignment and symmetry of beam maps. The data converter also compares the indexes to index values or symptoms of known abnormal ion beam scanning, which allows the data converter to recognize abnormal ion beam scanning and indicate the proper corrective action to adjust the ion beam scanning. Thus, the two-dimensional beam map recognition analysis is reduced to a one-dimensional feature analysis, thereby simplifying the beam map recognition process. This simplified beam recognition process allows the automatic supervision system to achieve real time control of the ion beam scanning process, thereby reducing faulty implantation.

24 Claims, 18 Drawing Sheets

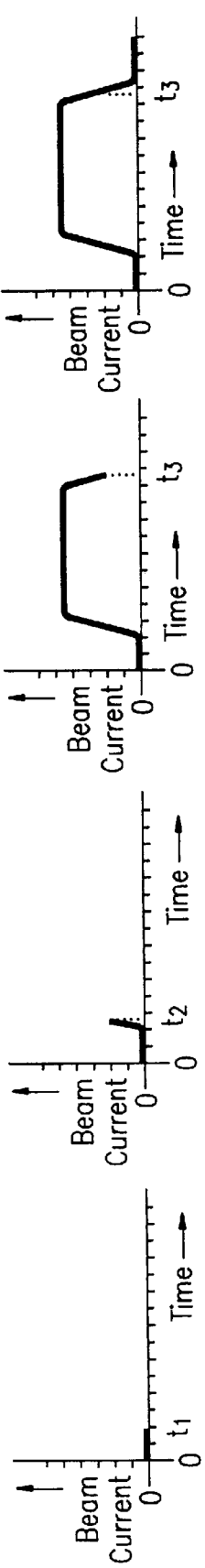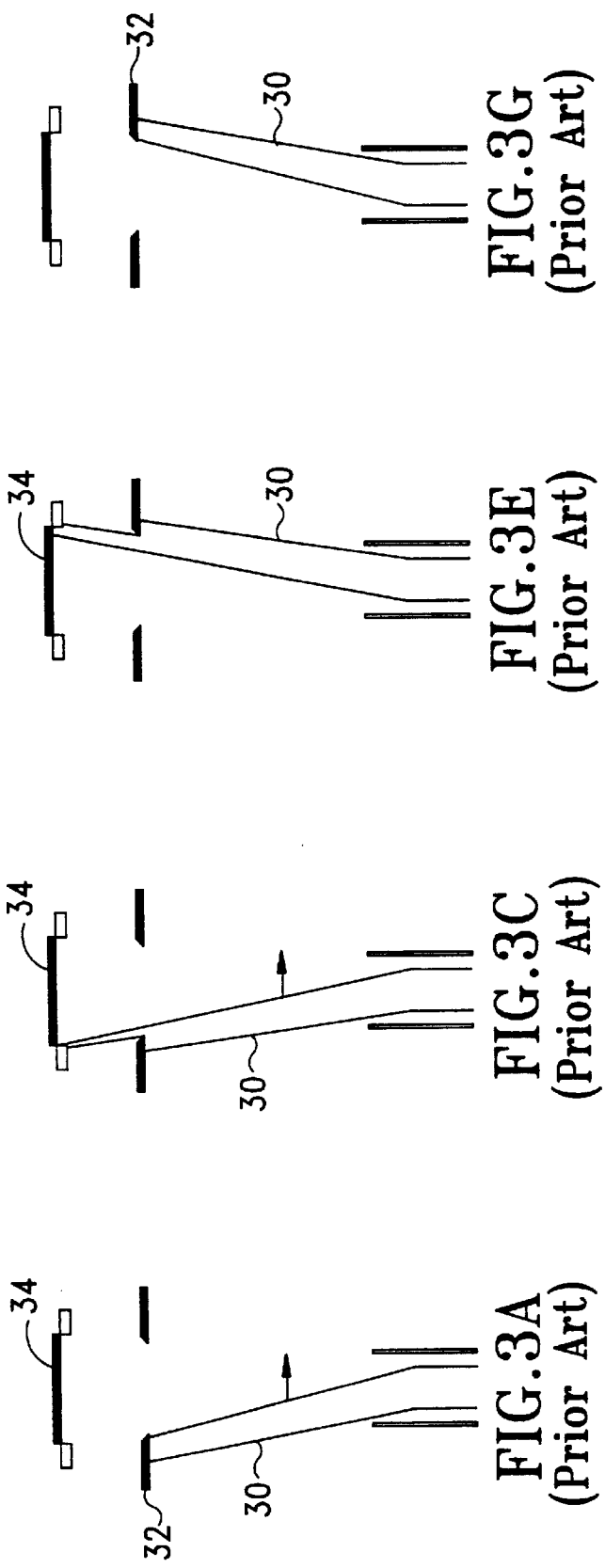

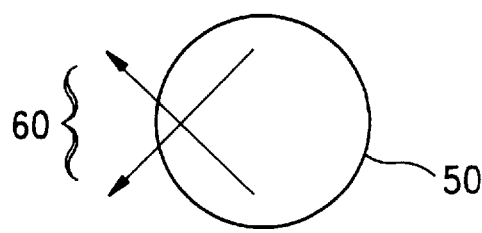
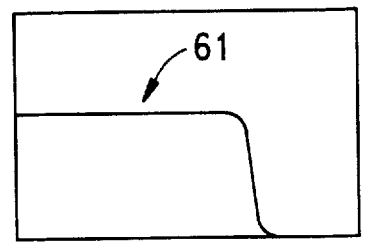
FIG.6A  FIG.6B
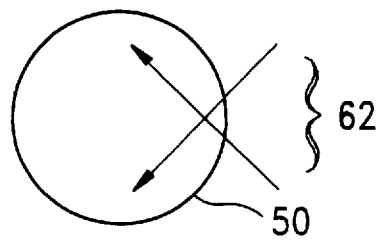
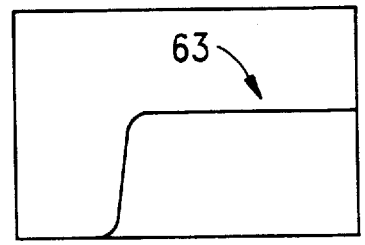
FIG.6C  FIG.6D
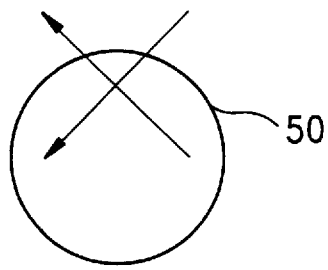
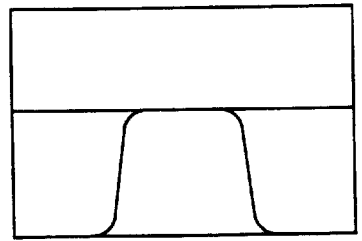
FIG.6E  FIG.6F

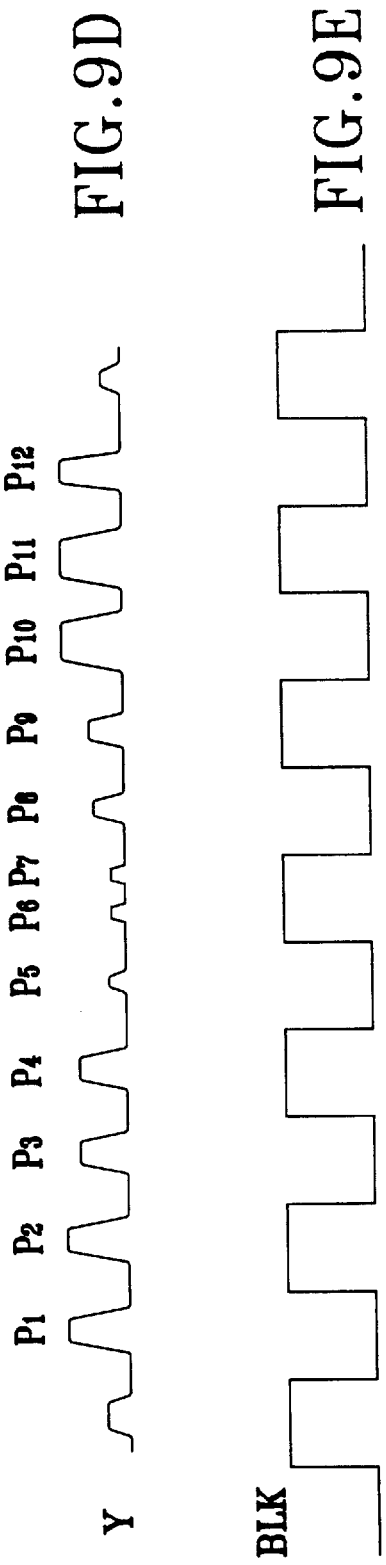

AUTOMATIC SUPERVISION SYSTEM ON THE ION BEAM MAP FOR ION IMPLANTATION PROCESS

CROSS REFERENCE TO RELATED APPLICATION

This invention is related to co-filed U.S. patent application Ser. No. 08/820,453 filed Mar. 17, 1997 entitled "Intelligent Supervision System with Expert System for Ion Implantation Process" assigned to same assignee as the present application and incorporated herein by reference in its entirety.

BACKGROUND OF THE INVENTION

1. Field of the Invention

The present invention relates to ion implantation systems, and particularly to ion implantation systems with an automatic supervision system using an ion beam map generated during ion implantation.

2. Description of the Prior Art

The electrical properties of a semiconductor crystal can be modified by introducing controlled amounts of dopant impurities into the crystal. Ion implantation and diffusion are the most commonly used methods to introduce impurities into a semiconductor wafer. In silicon semiconductor technology, for example, p-type impurities such as boron or $BF_2$, and n-type impurities such as arsenic, phosphorus, or antimony are typical dopants.

Doping of semiconductor wafers by diffusion is done by introducing impurities into the wafer and redistributing them within the semiconductor crystals at elevated temperature. Unlike diffusion, ion implantation is a low-temperature process in which ionized dopants are accelerated to high energies so that the dopants penetrate to a certain depth when they impact on a target wafer. During the past two decades, ion implantation has become the preferred method of doping semiconductors because of its flexibility in achieving different impurity profiles, and its better control of dopant concentration.

FIG. 1A shows the block diagram of a typical ion implantation machine. The main elements of the machine include an ion source 10, beam transport 12, a target chamber 14 and a man-machine interface 16. The ion source 10 produces a high-density of ions from which the beam transport 12 extracts a focused beam of ions and transports to the target wafer in the target chamber 14.

FIG. 1B shows the schematic of a typical beam transport 12, which includes a mass analyzer 120, an accelerator 124, a focusing system 126, and a scan system 128. The mass analyzer 120 is used to select one of many types of ions from the ion source 10 through the use of a strong magnetic field that separates the ions according to their mass-to-charge ratio. After leaving the mass analyzer 120, the ion beam is accelerated by the accelerator 124 to gain the desired kinetic energy. Next, the accelerated ion beam is focused by the focusing system 126, and then is swept both vertically and horizontally by the scan system 128 across the wafer 140 to distribute the dopants uniformly over the surface of the wafer 140 which is mounted in the target chamber 14. The scan system 128 typically includes X-scan plates 1280 and Y-scan plates 1282.

The man-machine interface 16 (FIG. 1A) is used by an operator to control implantation system parameters, such as recipe, acceleration voltage or ion dosage. This interface 16 can also display other system parameters, such as beam current, on a screen so that the operator can continuously monitor the implantation process. The operator can adjust the implantation process as necessary by controlling, for example, the X-plate and Y-plate voltage by manipulating an adjustment stick, which is commonly referred to as a joystick.

FIG. 2 shows an ion beam map as displayed on the man-machine interface 16 (FIG. 1), which is typically used in supervising an ion implantation process during the fabrication of an integrated circuit. FIGS. 3A to 3H demonstrate the formation of the beam map. Referring to FIG. 3A, ion beam 30 is blocked before time $t_1$ by the beam defining aperture 32, so that the beam current reaching the wafer 34 remains zero as shown in FIG. 3B. Next, as shown in FIG. 3C, the ion beam 30 begins to sweep onto the wafer 34 at time $t_2$. Because part of the ion beam 30 contacts the wafer 34, the beam current rises as shown in FIG. 3D. Referring to FIG. 3E, the entire ion beam 30 sweeps across the wafer 34 between time $t_2$ and $t_3$, resulting a constant maximum beam current as shown in FIG. 3F. Finally, as the ion beam 30 is blocked again by the other end of the beam defining aperture 32 after $t_3$ (FIG. 3G), the beam current decreases as shown in FIG. 3H.

Each time the ion beam sweeps across the wafer, the beam map display generates a different trace. The width of the trace is proportional to the length of the beam path across the wafer. FIGS. 4A to 4D illustrate examples of different traces and the corresponding beam path across the wafer. In FIG. 4A, the ion beam path 40 sweeps through the center of the wafer 41, resulting in a trace 42 having the longest width when displayed on the beam map. This trace 42 is commonly referred to as the outmost edge, and corresponds to the outmost trace 21 shown on the composite beam map in FIG. 2. Referring to FIG. 4B, the beam path 43 across the wafer 41 does not pass through the center of the wafer and, thus, has a shorter length on the wafer 41 than the beam path 40 (FIG. 4A), resulting in a trace 44 as shown in FIG. 4B. As the ion beam scans nearer to the edge of the wafer 41 as in beam path 45, a narrower trace 46 is displayed as shown in FIG. 4C. When the ion beam 47 finally reaches the edge of the wafer 41, the resultant trace 48 has a narrowest width. The traces 44, 46, and 48 described above are commonly referred to as minors, which correspond to the traces under the outmost edge 21 on the composite beam map as shown in FIG. 2.

The beam map display is conventionally used as part of a supervision system in the ion implantation process to ensure that the implantation process parameters such as recipe, acceleration voltage, and ion dosage are within tolerances and the ions are uniformly implanted on the wafer. In order to keep the implantation process in proper adjustment, the operator needs to continuously observe the beam map display for the occurrence of an abnormal beam map (indicating the implantation process is out of adjustment) and take corrective measures to prevent further damage to the wafer. These corrective measures include adjusting the implantation system parameters; e.g., the X-plate and Y-plate voltage, or even shutting down the implanter. Unfortunately, the analysis of the ion beam display has no standard criterion. This analysis largely depends on the accumulated experience of the operator, which can result in unnecessary or improper adjustment. Further, this manual adjustment by the operator is usually too slow to prevent defective implantation of the wafer, resulting in the failure of the wafer during quality testing. Other approaches may include using a video camera to monitoring the beam map display, using techniques disclosed by Banks in "Signal Processing, Image processing and Pattern Recognition", Prentice Hall, 1990. Complex two-dimensional image processing techniques are used to try to recognize abnormal ion beam maps. However, this approach tends to be impractical due to the complexity of the two-dimensional image processing, which slows down the recognition process so that a relatively large number of faulty implantations occur before abnormal beam scanning is recognized. Thus, a need has arisen for a low cost supervision system that can quickly, automatically and accurately identify symptoms of abnormal ion beam scanning to maintain the quality of the ion implantation process in real time.

SUMMARY OF THE INVENTION

In accordance with the present invention, an automatic supervision system for ion implantation processes is disclosed which utilizes the ion beam map generated by a typical ion implantation machine. The supervision system includes a feature extraction circuit to extract features of the ion beam map that are indicative of the positions of the outmost edge and minors of the beam map. More specifically, in one embodiment the feature extraction circuit is coupled to receive a beam current signal and a display blanking signal, which the ion implantation machine generates to form the ion beam map. The feature extraction circuit then extracts predetermined information from the beam current signal and the display blanking signal. As a result, the two-dimensional beam maps are advantageously reduced to one-dimensional features that can be easily analyzed. The supervision system also includes a data converter coupled to the feature extraction circuit which converts the extracted features into indexes. These indexes are generated and analyzed in real time to recognize and flag symptoms of abnormal beam scanning that may occur during the ion implantation process.

In one embodiment, the aforementioned feature extraction circuit includes a circuit for measuring: (a) the time period measured from the start of beam scan to the instant the beam current reaches a predetermined threshold, which is referred to herein as the left segment; (b) the time duration that the beam current exceeds the predetermined threshold, which is referred to herein as the center segment; and (c) the time period measured from the instant that the beam current drops below the predetermined threshold until the end of the beam scan, which is referred to herein as the right segment.

In this embodiment, the data converter receives and stores these time measurements and then generates: (1) the mean of the left segment for several outmost edge traces; (2) the mean of the center segment for these outmost edge traces; (3) the mean of the left segment of these outmost edge segments; (4) the variance of the left segment of several outmost edge traces; (5) the variance of the right segment of several outmost edge traces; (6) the variance of the left segment of several minor traces and (7) the variance of the right segment of these several minor traces. The data converter then uses these values to calculate several indexes that reflect the alignment and shape of the beam map with the values of these indexes for known abnormal symptoms. Because these indexes are easily and quickly generated from features that are easily and quickly extracted from the beam map, the automatic supervision system can, in real time, recognize abnormal symptoms in the beam map and send alarm signals to the operators indicating the abnormal condition and the appropriate corrective action. In a further refinement, in ion implanters that provide access to the joystick controls, the data converter can provide control signals emulating the joystick controls to automatically provide the appropriate corrective action.

In one embodiment, the feature extraction circuit is adapted to utilize the beam current signal and the display blanking signal generated by many commercially available ion implanters for generating the beam map on a display or monitor in the man-machine interface. The feature extraction circuit is implemented in this embodiment using a first comparator for comparing the beam current signal with a predetermined beam threshold current to detect whether the beam current is greater than the threshold. An inverter is coupled to receive the output signal of the first comparator, providing the complement of the first comparator's output signal. The feature extraction circuit also includes a second comparator for comparing the blanking signal with a predetermined blanking signal threshold to detect when a beam scan begins. A first two-input AND gate is coupled to receive the inverted output signal the first comparator and the output signal of the second comparator. As a result, for each beam scan, the first AND gate outputs a pair of pulses. The first pulse has a width corresponding to the length of the left segment, whereas the second pulse has a width corresponding to the length of the right segment. A first counter measures the duration of each of these pulses. A second two-input AND gate is coupled to receive the output signal of the first comparator and the output signal of the second comparator. Consequently, for each beam scan, the second AND gate outputs a pulse having a width corresponding to the width of the center segment. A second counter measures the duration of the center segment. The time durations of the left, right and center segments for each beam scan are provided to the data converter. The data converter is implemented in this embodiment with a standard programmable processor readily available at relatively low cost.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIGS. 3A to 3H are diagrams illustrating the formation of an ion beam map;

FIGS. 6A to 6L are diagrams illustrating abnormal scans caused by mis-located scan paths;

FIGS. 9D and 9E illustrate more realistic waveforms of the signal Y and signal BLK;

FIG. 9F illustrates corresponding scan on the beam map for each Y pulse in FIG. 9D;

DESCRIPTION OF THE PREFERRED EMBODIMENT

Figure 1A:
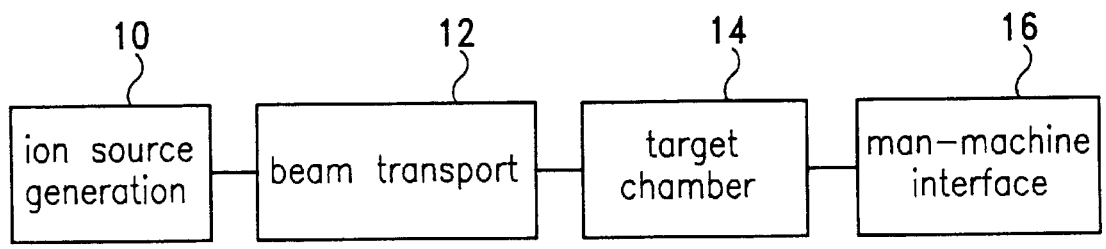
FIG. 1A is a block diagram of a typical ion implantation machine.
Figure 2:
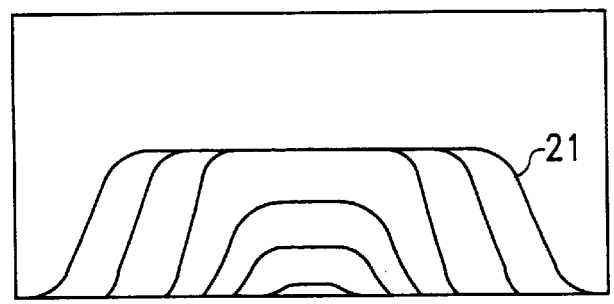
FIG. 2 illustrates a display of an ion beam map from a typical ion implantation machine.
Figure 1B:
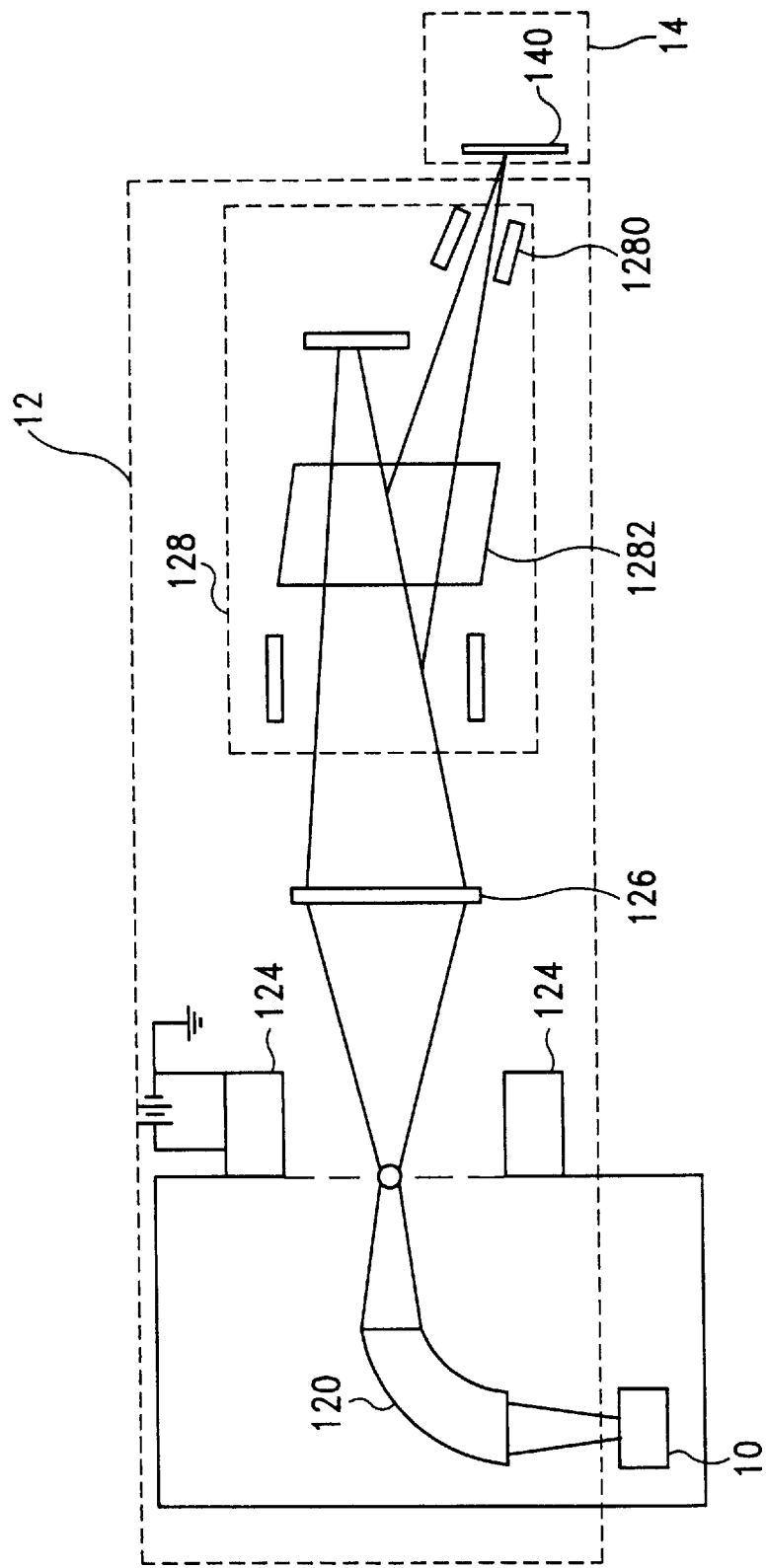
FIG. 1B is a schematic diagram of a beam transport of a typical ion implantation machine.
Figure 4A:
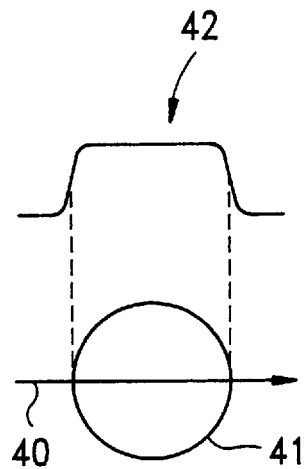
FIGS. 4A to 4D are diagrams illustrating examples of the relationship between a trace of an ion beam map and the scan path of the ion beam across a wafer.
Figure 4B:
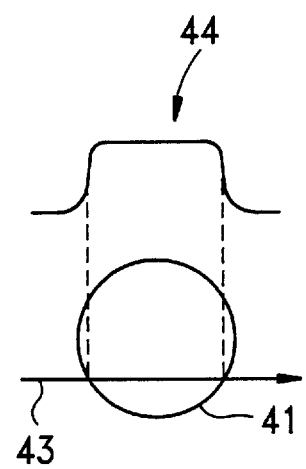
Figure 4C:
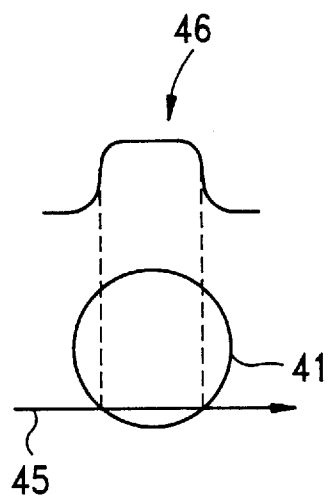
Figure 4D:
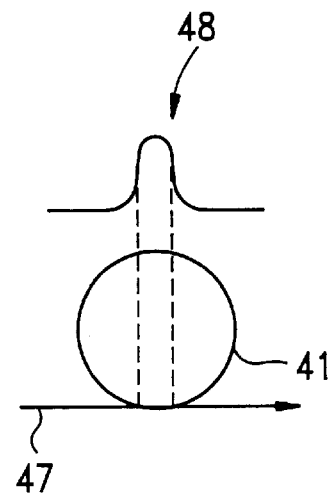
Figure 5:
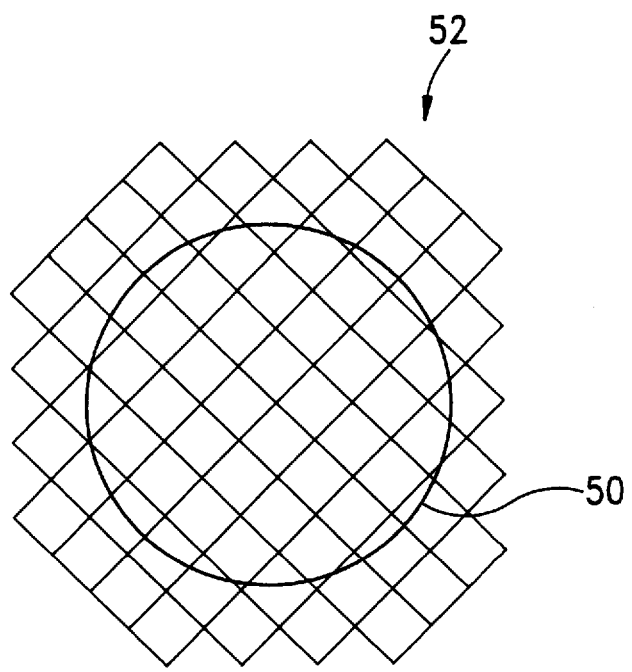
FIG. 5 is a diagram illustrating an ion beam scan pattern on a wafer in an ion implantation process.

FIG. 5 schematically shows a typical scan pattern performed by an ion implantation machine on a wafer 50 during an ion implantation process. In this embodiment, the ion implantation machine is a model NV-6200 A/AV implanter available from Eaton Corporation, Cleveland, Ohio. Other embodiments of the present invention can be adapted to other similarly structured implanters. The scan pattern 52 is achieved by varying of the voltage on the X-Y scan plates (see FIG. 1B) to alter the trajectory of the ion beam, thereby scanning the ion beam across the wafer. In order to uniformly implant ions, the scan pattern 52 is ideally centrally located on the wafer 50. Abnormal scan is commonly classified into two types: the first type of abnormal scan is caused by the un-centrally located scan pattern as shown in FIGS. 6A, 6C, 6E, and 6G. FIGS. 6B, 6D, 6F, and 6H show the corresponding ion beam map corresponding to the misaligned scan patterns depicted in FIGS. 6A, 6C, 6E and 6G, respectively.

Figure 6G:
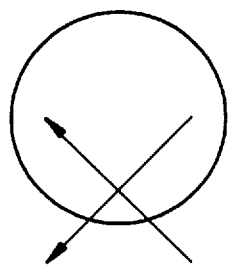
Figure 6H:
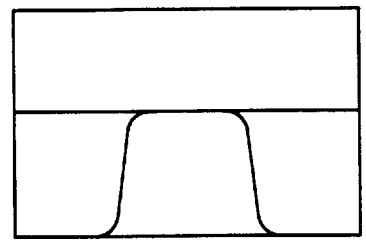
Figure 6I:
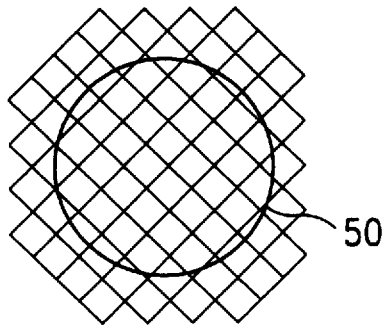
Figure 6J:
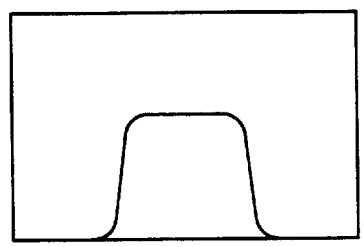
Figure 6K:
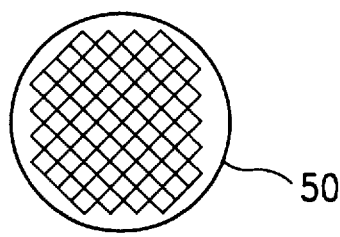
Figure 6L:
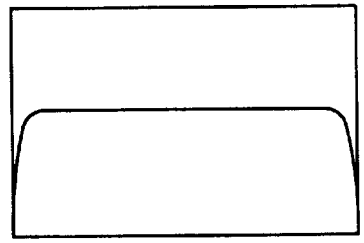
Figure 6M:
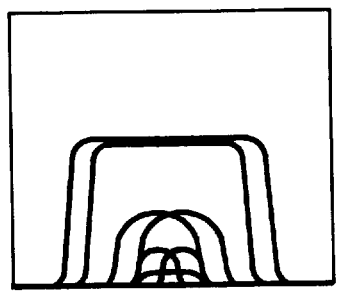
FIG. 6M is a diagram illustrating a Y-magnitude failure.

Referring to FIG. 6A, the scan pattern can be misaligned so that the center of the scan pattern is located to the center and left of the wafer. As shown in FIG. 6A, the center 60 of the scan pattern is located "center left" on the wafer 50, causing the beam map 61 (FIG. 6B) to be shifted to the left. Conversely, when the center 62 of the scan pattern is "center right" as indicated in FIG. 6C, the corresponding beam map 63 (FIG. 6D) is shifted to the right. FIGS. 6E and 6G respectively show a "center high" and a "center low" alignment of the scan pattern, and their resultant beam maps are shown in FIGS. 6F and 6H. There is further a Y-magnitude failure as shown in FIG. 6M, in which the outmost edge is symmetric while the minors are asymmetric.

The second type of abnormal scan is caused not by misalignment of the scan pattern, but by an over-spanned scan path or an under-spanned path. Referring to FIG. 6I and its corresponding beam map shown in FIG. 6J, an over-spanned scan path is illustrated. In an over-spanned scan path, a substantial portion of the scan pattern extends beyond the wafer 50. As a result, a significant portion of the ion implantation process is not directed onto the wafer and, thus, is wasted. Further, a relatively longer time is required to implant the wafer. On the other hand, as shown in FIG. 6K, an under-spanned scan path causes the outer portions the wafer to be uncovered by the scan pattern. Consequently, the outer portions are not implanted. FIG. 6L shows the beam map corresponding to an under-spanned scan path.

Figure 7A:
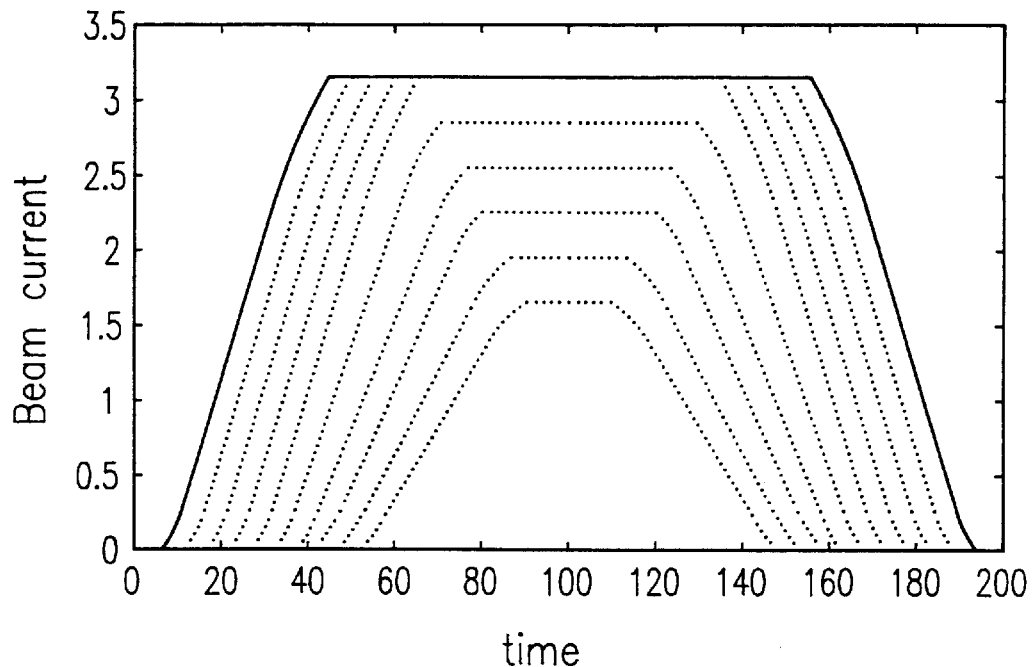
FIGS. 7A to 7F are diagrams showing typical composite ion beam maps.
Figure 7B:
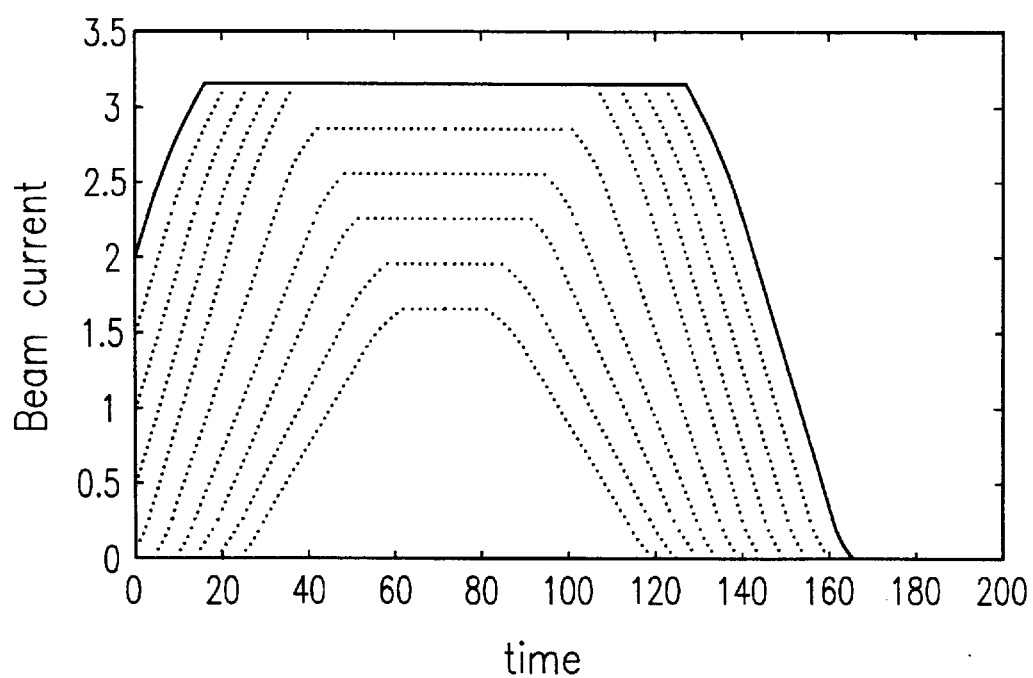
Figure 7C:
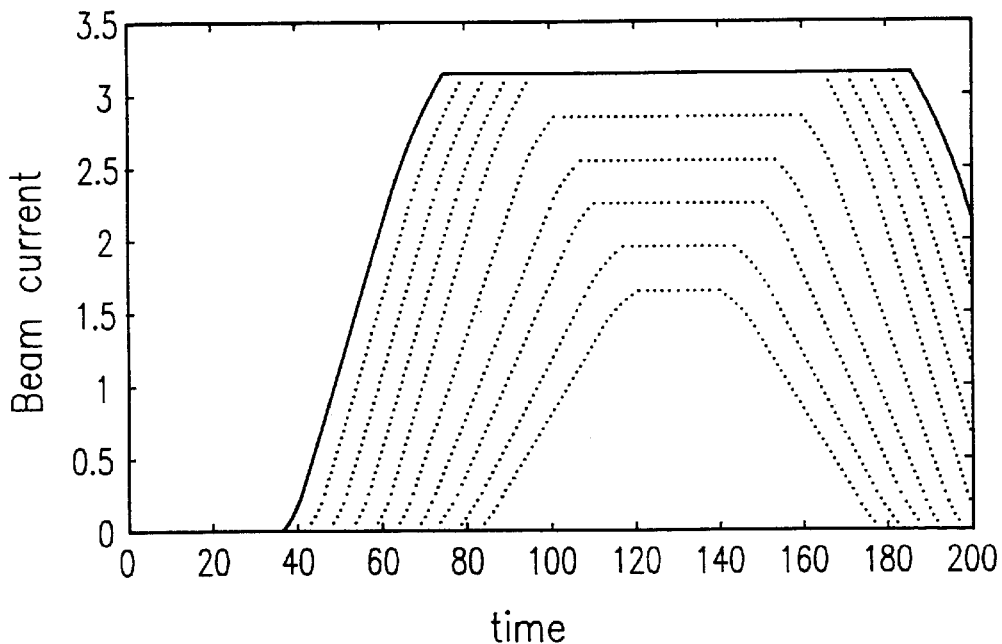
Figure 7D:
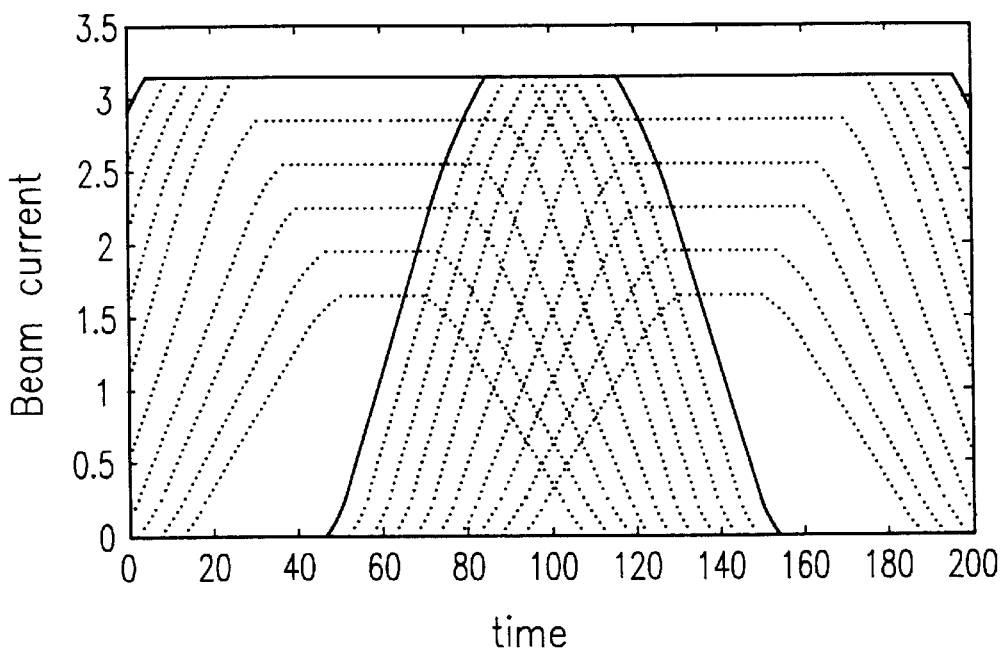
Figure 7E:
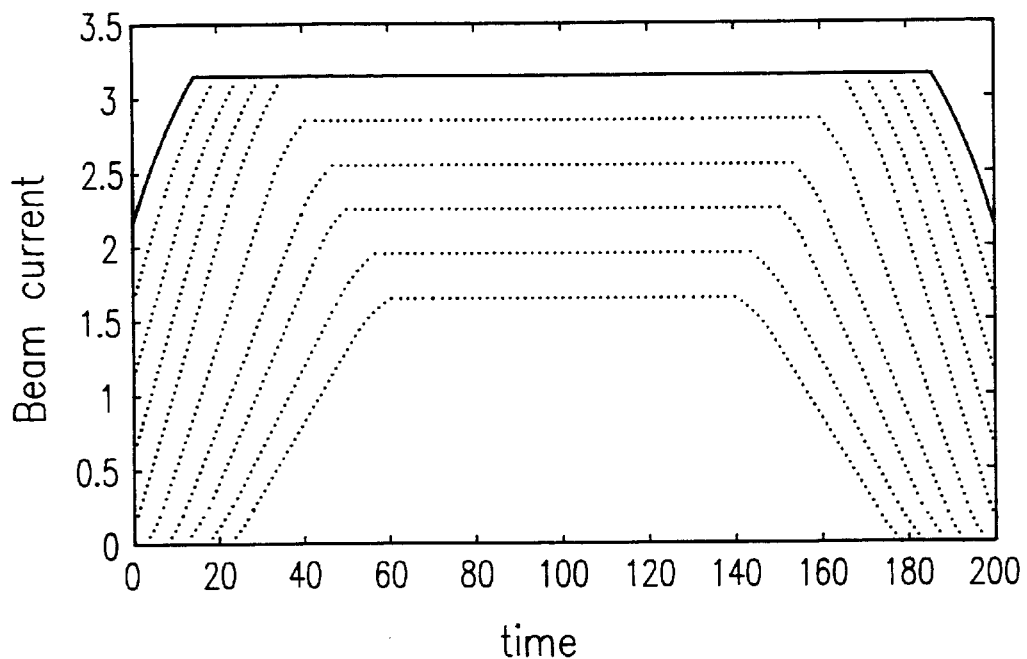
Figure 7F:
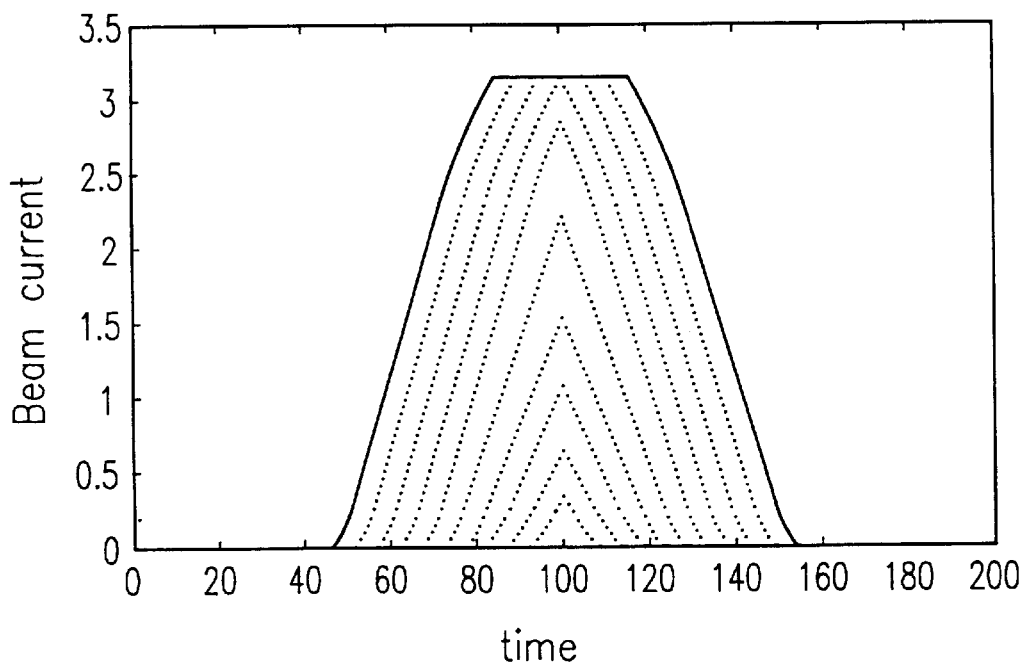

FIGS. 7A to 7F show typical composite beam maps for various scanning situations as generated by a NV-6200 A/AV implanter. FIG. 7A shows an example of a normal scan. FIG. 7B and FIG. 7C respectively show examples of the left-shifted and right-shifted beam maps caused by center-left and center-right abnormal scan patterns. FIG. 7D illustrates an example in which a Y-center failure occurs. FIG. 7E and FIG. 7F respectively show examples of over-spanned and under-spanned scan path beam maps.

Figure 8:
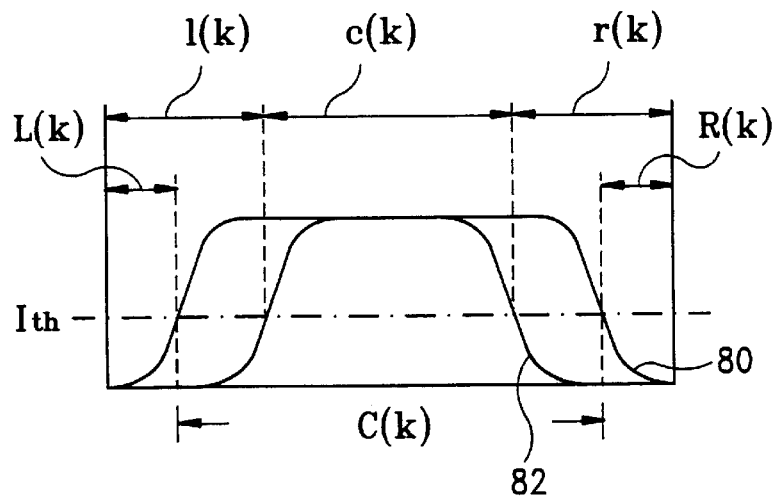
FIG. 8 is a diagram showing a typical beam map from an ion implanter with predetermined features defined thereon.

FIG. 8 shows a typical beam map from an ion implanter, where the outmost edge 80 of the beam map is centered and symmetric with appropriate width, and the minor trace 82 (only one minor is shown for clarity) is under the outmost edge 80 and is symmetric. Using a predetermined threshold beam current $I_{th}$, for each frame of the beam map, the outmost edge 80 is decomposed into a left segment, a center segment and a right segment. The duration of the left, center and right segments of the outmost edge are denoted L(k), C(k), and R(k), respectively, where k represents discrete time. More specifically, the left segment duration L(k) spans from the start of the outmost edge 80 to the point in time at which the beam current equals the predetermined threshold beam current $I_{th}$. The center segment duration C(k) is equivalent to the time that the outmost edge is greater than the predetermined threshold beam current $I_{th}$. The right segment duration R(k) is span of time from the end of the center segment C(k) until the end of the outmost edge 80. In a similar manner, the minor trace 82 is decomposed into a left segment, a center segment and a right segment, with durations l(k), c(k), and r(k), respectively. The left, center and right segment durations of the other minors (not shown) are also determined.

Figure 9A:
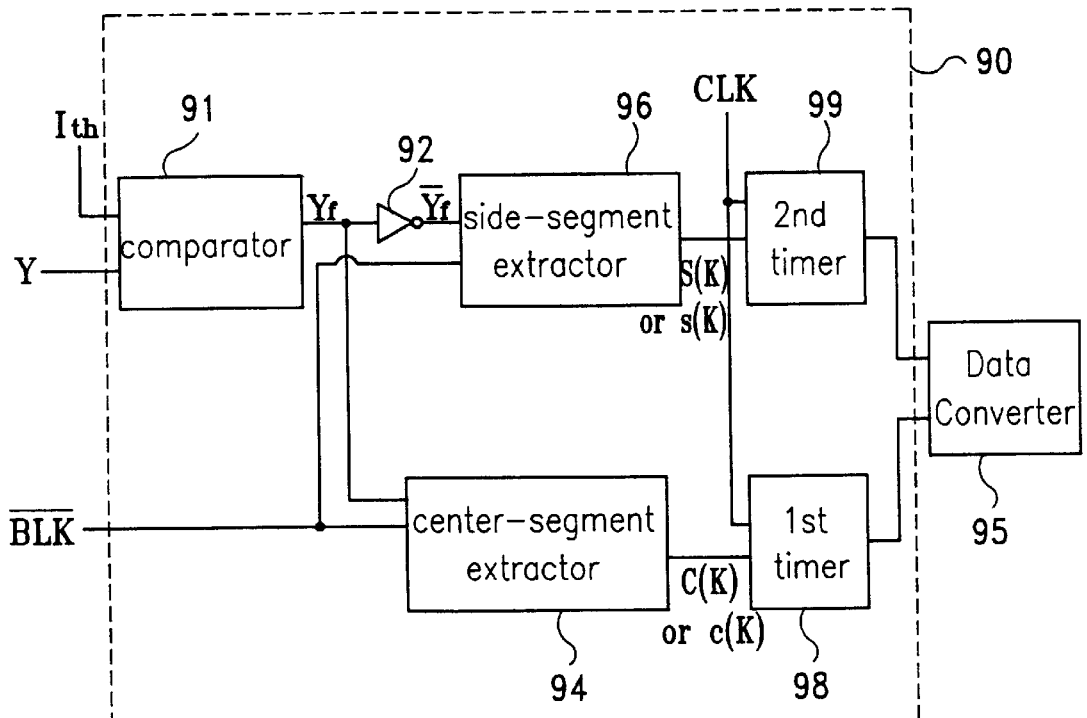
FIG. 9A is a block diagram of a real-time feature extracting circuit according to one embodiment of the present invention.

FIG. 9A shows a block diagram of one embodiment of a real-time automatic supervision system for an ion implanter that includes a feature extractor 90 that is used to extract the features L(k), l(k), C(k), c(k), R(k) and r(k) of the outmost edge and the minors. The feature extracting system includes a comparator 91, which is coupled to receive the beam current signal Y from the implanter and a threshold signal dependent on the predetermined threshold beam current $I_{th}$. The beam current signal Y has a voltage with a magnitude dependent on the magnitude of the beam current. The comparator 91 outputs a feature signal $Y_f$, which, in effect, indicates whether the beam current is above or below the predetermined threshold beam current $I_{th}$. An inverter 92 is connected to receive the feature signal $Y_f$, thereby generating the inverted feature signal $\overline{Y_f}$.

A center-segment extractor 94 is coupled to receive the feature signal $Y_f$ and an inverted display blanking signal $\overline{BLK}$ from the implanter. In this embodiment, the implanter generates the display blanking signal BLK in an active-low signaling format; that is, the beam current signal Y is displayed when the display blanking signal BLK is at a logic low level. From the feature signal $Y_f$ and the inverted blanking signal $\overline{BLK}$, the center-segment extractor 94 generates an output signal having a pulse with a width dependent on the length of the center segment (i.e., either C(k) or c(k)), of the trace of the beam map displayed in the man-machine interface (see FIG. 1A).

In a similar manner, a side-segment extractor 96 extracts the left-and-right segment characteristic portion of the feature signal $Y_f$ by processing the inverted feature signal $\overline{Y_f}$ and the inverted display blanking signal $\overline{BLK}$. More specifically, because the comparator 91 generates the feature signal $Y_f$ with a logic high level when the beam current is above the predetermined threshold beam current $I_{th}$, the inverted feature signal $\overline{Y_f}$ is at a logic high level when the beam current is below the predetermined threshold beam current $I_{th}$. In this embodiment, the side-segment extractor 96 generates from the inverted feature signal $\overline{Y_f}$ and the inverted display blanking signal $\overline{BLK}$ an output signal having a pair pulses for each trace of the beam map displayed on the man-machine interface. The first pulse of the pair has a width dependent on the length of the left segment (either L(k) or l(k)), whereas the second pulse of the pair has a width dependent on the length of the right segment (either R(k) or r(k)).

The center-segment extractor 94 provides its output signal to a first timer 98, so that the duration of the center segment can be measured. Similarly, the side segment extractor 96 provides its output signal to a second timer 99, so that the duration of the left segment and the right segment can be determined. The durations of the segments L(k), C(k) and R(k) of the outmost edge (or l(k), c(k) and r(k) for a minor) are then provided to the data converter 95. The data converter 95 is implemented in this embodiment with a computing machine, such as a personal computer, for further processing (described below in conjunction with FIGS. 10–12F). Through the use of the feature extractor 90, the two-dimensional beam map is reduced to one-dimensional signals that numerically represent three features (i.e., the center segment, the left segment, and the right segment) of the outmost edge and the minors of the beam map provided by the ion implanter. These one-dimensional signals can be more quickly and easily analyzed than the two-dimensional beam map, thereby allowing real-time automatic supervision of the implant process.

Figure 9B:
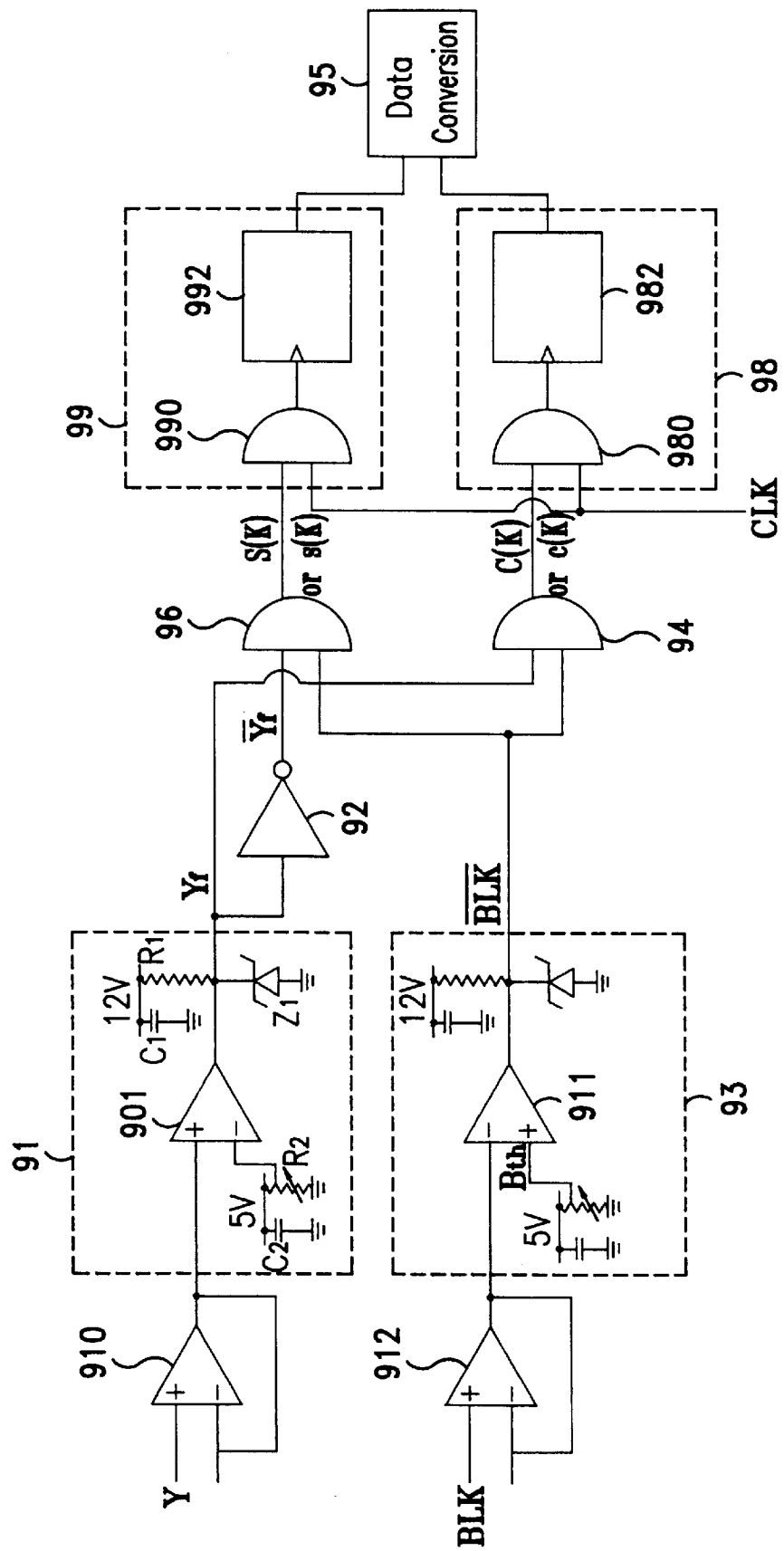
FIG. 9B is a schematic diagram of one implementation of the feature extracting circuit.
Figure 9C:
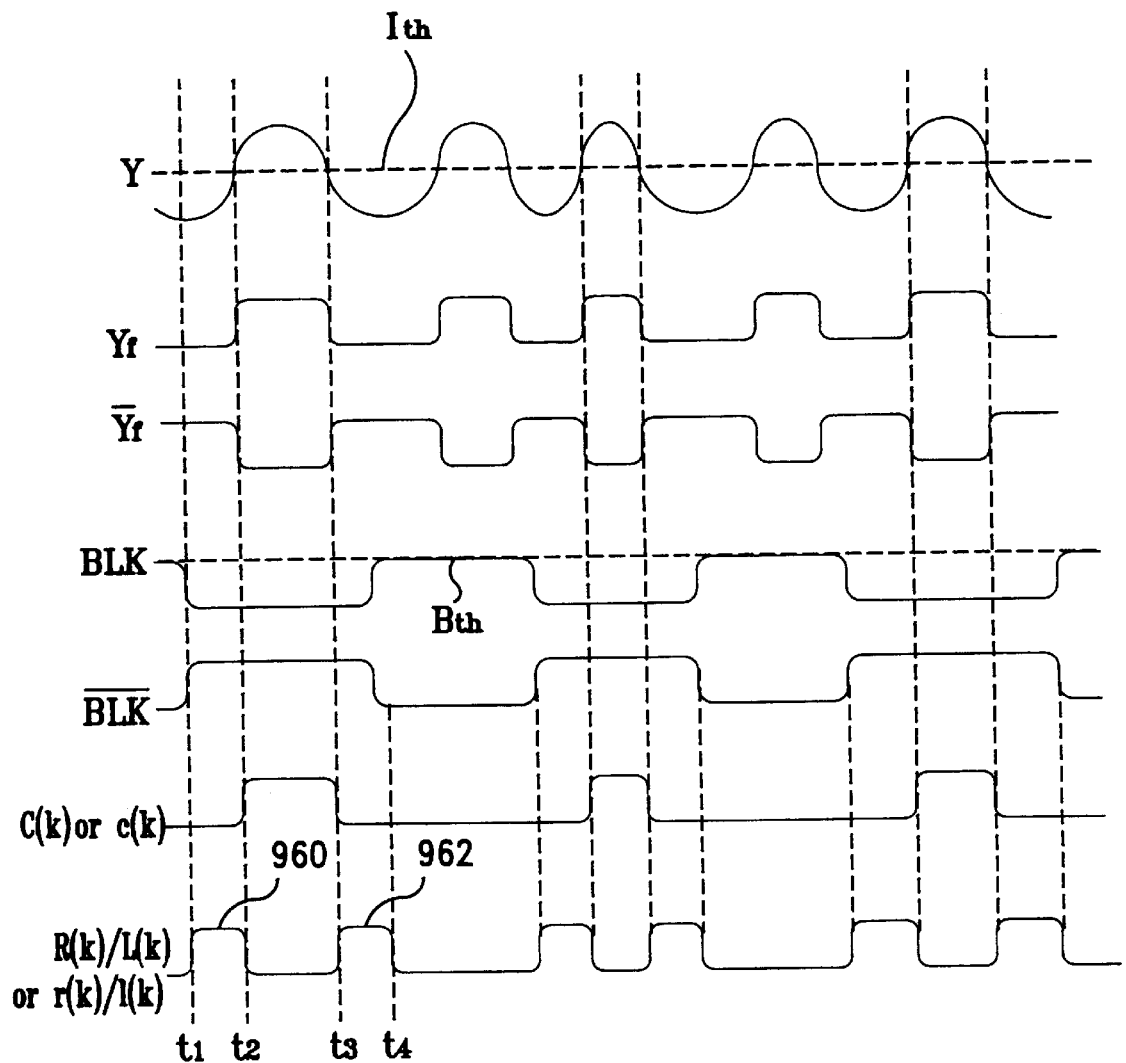
FIG. 9C are timing diagrams illustrating the operation of the feature extraction circuit of FIG. 9B.

FIG. 9B illustrates one embodiment of the implementation of the feature extractor 90 of FIG. 9A. A timing diagram illustrating the operation of this embodiment of the feature extractor 90 is shown in FIG. 9C. The beam current signal Y is provided by the implanter as an analog signal. FIG. 9C shows an example of the beam current signal Y as provided by the implanter. The beam current signal Y is buffered by a unitary gain buffer circuit 910. In this embodiment, the buffer circuit 910 is implemented by connecting the non-inverting input terminal of a conventional operational amplifier (e.g., a standard "741" op-amp) to receive the beam current signal Y and the output lead of the operational amplifier to the inverting input terminal, thereby forming a voltage follower.

The output lead of the buffer circuit 910 is connected to the non-inverting input lead of the comparator 91. In this embodiment, this comparator 91 is implemented using a conventional model 311 operational amplifier 901. A zener diode Z1 having a breakdown voltage of about 5.3 volts is connected between the output lead of the operational amplifier 901 and ground to form a clamp that limits the output voltage of the operational amplifier 901 to a value between 5.3 volts and the ground potential. In addition, a resistor R1 is connected between the output lead of the operational amplifier 901 and a twelve volt voltage source, thereby serving as a pullup resistor to ensure that the comparator 91 will provide a logic high output voltage of about 5.3 volts. A capacitor C1 is connected between the twelve volt source and ground to help reduce noise.

The inverting input terminal of the comparator 91 is connected to a variable resistor R2. The variable resistor R2 is connected to a five volt voltage source and provides a voltage that is adjustable between zero to five volts to the comparator 91. The variable resistor R2 is adjusted to provide a voltage corresponding to value of the aforementioned predetermined threshold beam current $I_{th}$. A capacitor C2 is connected between the 5 volt source and ground to help reduce noise. The feature signal $Y_f$ is then generated as described above in conjunction with FIG. 9A. The feature signal $Y_f$ is at a logic high level when the beam current is above the predetermined threshold $I_{th}$ and a logic low level when the beam current is below the predetermined threshold $I_{th}$, as shown in FIG. 9C. In addition, the inverter 92 is coupled to receive the feature signal $Y_f$, thereby generating the inverted feature signal $\overline{Y_f}$ as shown in FIG. 9C.

In order to provide a digitized inverted display blanking signal $\overline{BLK}$, the display blanking signal BLK from the implanter is firstly buffered by another unitary gain buffer circuit 912, which is substantially similar to the buffer circuit 910. An example of the display buffer signal BLK is shown in FIG. 9C. A comparator 93 is then connected to receive the buffered display blanking signal BLK from the buffer circuit 912. The comparator 93 is implemented with a standard "311" operational amplifier 911. The comparator 93 is structurally similar to the comparator 91, except that the buffered blanking signal BLK is fed to the inverting input terminal of the operational amplifier 911, and a blanking threshold voltage $B_{th}$ is fed to the non-inverting input terminal. The threshold voltage $B_{th}$ is adjustably provided by a variable resistor as described for the voltage corresponding to $I_{th}$ in the comparator 91. The purpose of the threshold voltage $B_{th}$ is to invert the signal BLK without unexpected voltage drift which might miss-trigger counters 982 and 992. The inverted blanking signal $\overline{BLK}$ is thereby generated by the comparator 93 as shown in FIG. 9C. More specifically, the inverted blanking signal $\overline{BLK}$ is at a logic high level from the beginning to the end of each frame of the beam map and is at a logic low level between frames.

The aforementioned center-segment extractor 94 of FIG. 9A is implemented with a conventional two-input AND gate. The AND gate 94 is connected to receive the feature signal $Y_f$ and the inverted display blanking signal $\overline{BLK}$. As a result, the AND gate 94 generates a pulse for each frame of the beam map that represents the feature C(k) for an outmost edge or the feature c(k) for a minor. That is, the width of each pulse provided by the AND gate 94 has a duration equal to the duration of the center segment of the outmost edge or a minor of the beam map. The output signal of the AND gate 94 is shown in FIG. 9C.

The side-segment extractor 96 of FIG. 9A is implemented with a two-input AND gate connected to receive the inverted feature signal $\overline{Y_f}$ and the inverted display blanking signal $\overline{BLK}$. As a result, for each frame of the beam map, the AND gate 96 generates two pulses, with the first pulse corresponding to the left segment duration L(k) of an outmost edge (or l(k) of a minor) and the second pulse corresponding to the right segment duration R(k) of the outmost edge (or r(k) of the minor).

Referring to FIG. 9C, during the active span of the inverted blanking signal $\overline{BLK}$ between times $t_1$ and $t_4$, the feature signal Y is logically ANDed with the signal $\overline{BLK}$, resulting in a pulse representing the feature C(k) or c(k), whose active span between time $t_2$ and $t_3$ represents the duration of the center-segment feature of the beam map. In addition, the logical ANDing of the inverted feature signal $\overline{Y_f}$ and the signal $\overline{BLK}$ generates a left-segment pulse 960 between the times $t_1$ and $t_2$ and a right-segment pulse 962 between the times $t_3$ and $t_4$.

Referring back to FIG. 9B, the output signal from the AND gate 94, representing C(k) or c(k), is provided to the first timer 98 to measure the duration (i.e., the difference $t_3-t_2$ in the example shown in FIG. 9C) of the center segment of the outmost edge or the minor. In this embodiment, the timer 98 is implemented with a two-input AND gate 980 having its output lead connected to the clock input lead of a conventional counter 982. The AND gate 980 is connected to receive a clock signal CLK and the output signal of the AND gate 94. Consequently, the clock signal CLK passes through the AND gate 980 between the times $t_2$ and $t_3$, and the number of clock cycles between the times $t_2$ and $t_3$ are counted by the counter 982. In this embodiment, the clock signal CLK has a frequency of about 8 MHz, which is generally much greater than the frequency of the blanking signal BLK to allow accurate measurement of the center segment duration. The output signals of the counter 982 digitally represent the total number of the incoming clock cycles of the clock signal CLK between time $t_2$ and $t_3$. Thus, the features of the beam map are quickly extracted using a relatively simple, low cost circuit. The counters 982 and 992 are reset when the signal BLK goes high.

Similarly, the second timer 99 is implemented with a two-input AND gate 990 and a counter 992. The AND gate 990 is connected to receive the output signal of the AND gate 96 and the clock signal CLK. Thus, the pulses representing the left and right segments are received by the AND gate 990. The counter 992 then receives the logic AND of the pulses and the clock signal CLK, which then counts the number of clock cycles in each pulse. Thus, for example, the counter 992 to counts the number of clock cycles in the time period between times $t_2$ and $t_1$ and in the time period $t_4$ and $t_3$ in the timing diagram of FIG. 9C). The counter 992 will not be reset between pulse. The count in the first counter 982 is latched in a buffer when $Y_f$ goes high, i.e., the end of the first pulse. For example, we have $N_1$ counts after the first pulse ends and latch it in a buffer. Then the counter 992 continues to count during the second pulse of S(k), e.g., we have total $N_2$ counts at the end of the second pulse. Therefore, $t_2-t_1=N_1$, and $t_4-t_3=N_2-N_1$. Both of the counts from the first counter 982 and the second counter 992 are provided to the data converter 95 for further processing. FIGS. 9D and 9E illustrate more realistic waveforms of the signal Y and signal BLK. The corresponding scan on the beam map for each Y pulse (i.e., $P_1$ to $P_{12}$) is shown in FIG. 9F designated with the same corresponding character.

Figure 10A:
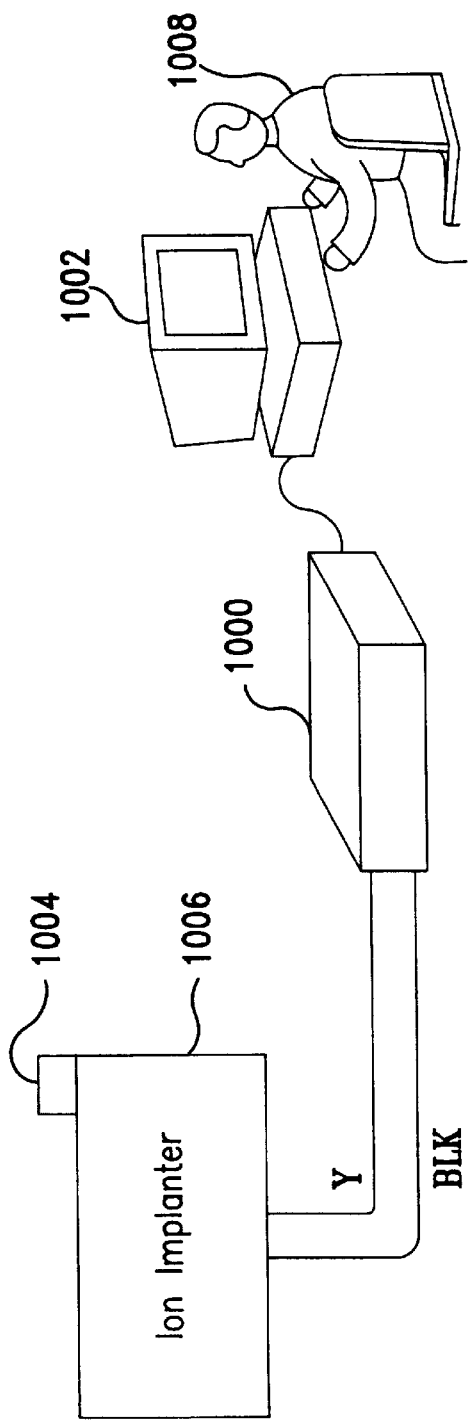
FIG. 10A is a diagram schematically illustrating one embodiment a supervision system according to the present invention.

FIG. 10A schematically shows one embodiment of a supervision system 1000 using the extracted features described above. In this embodiment, the feature extracting system of FIG. 9A, excluding the data converter 95, is embedded in a hardware interface 1001. The data converter 95 is realized by a standard personal computer 1002, which has a DX4-100 microprocessor. Thus, the computer 1002 is widely available at relatively low cost. The computer 1002 receives the durations L(k), l(k), C(k), c(k), R(k) and r(k) for several frames and stores this information in its memory. In one embodiment, the features L(k), l(k), C(k), c(k), R(k) and r(k) for about 300 frames are stored and then analyzed to determine whether an abnormal beam map exists, as described below in conjunction with FIGS. 11A–12F. An alarm 1004 on top of the implanter 1006 is used to alert the operator 1008 in response to an alarm signal (not shown in this figure) generated by the computer 1002 whenever an abnormal situation is detected and recognized. It is appreciated that the alarm 1004 may be located on other place, such as the computer 1002.

In this embodiment, the data converter 95 in FIGS. 9A and 9B is used to process the extracted features and generate several parameters indicative of the adjustment of the beam map. The calculations listed below in Table 1 are performed by the data converter 95. The computer 1002 can be easily programmed by those skilled in the art to calculate these seven parameters.

TABLE 1

| parameter 1 | mean of {L(k)} |
| parameter 2 | mean of {C(k)} |
| parameter 3 | mean of {R(k)} |
| parameter 4 | variance of {L(k)} |
| parameter 5 | variance of {l(k)} |
| parameter 6 | variance of {R(k)} |
| parameter 7 | variance of {r(k)} |

Figure 10B:
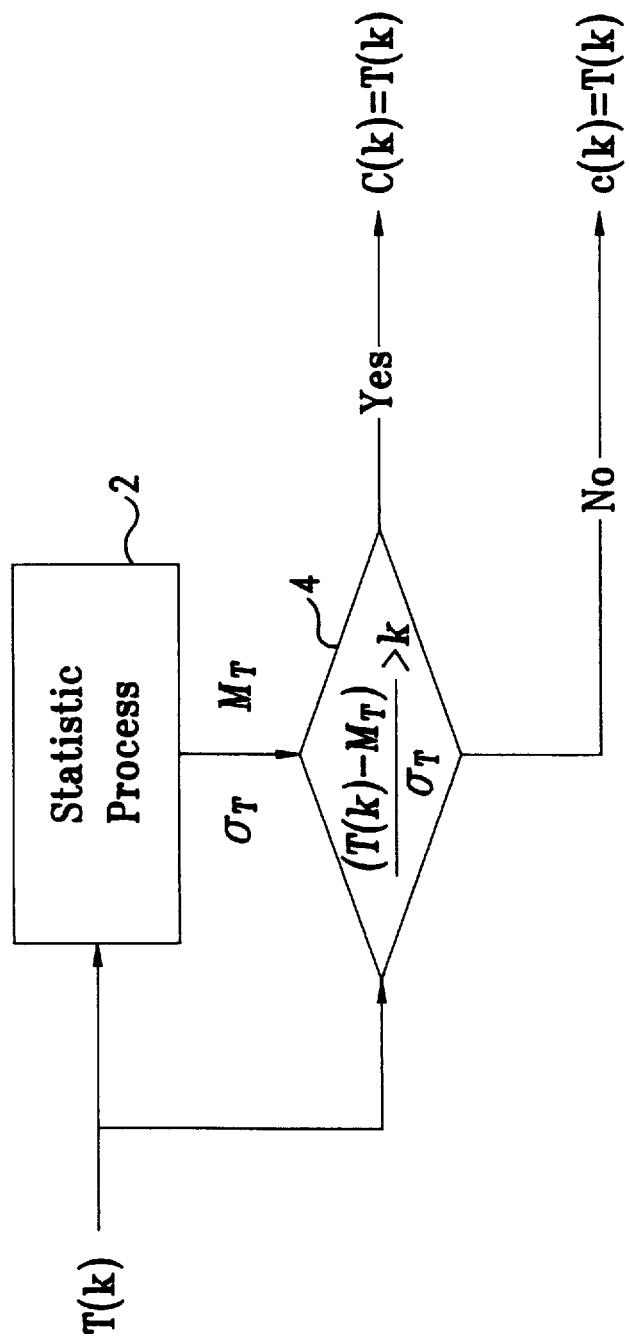
FIG. 10B is a flow diagram illustrating the calculation of c(k) and C(k)

The variance of l(k) and the variance of r(k) are calculated using all of the minors in a beam map. The calculation is done using a conventional method, for example, as shown in FIG. 10B, where T(k) is a sequence consisting of C(k) and c(k), $M_T$ is the mean of T(k), and $\sigma_T$ is the standard deviation of T(k). T(k) is processed by a conventional statistic process 2, and values of $\sigma_T$ and $M_T$ are calculated. After $(T(k)-M_T)/\sigma_T$ is compared with k in step 4, C(k) or c(k) is then generated. These parameters are then used to calculate several indexes which are used to recognize abnormal beam maps. These indexes are summarized below in Table 2.

TABLE 2

| index 1 | mean of C(k) |
| index 2 | mean of {L(k)} − mean of {R(k)} |
| index 3 | variance of {L(k)} + variance of {R(k)} |
| index 4 | variance of {l(k)} + variance of {r(k)} |

The index 1, i.e., the mean of C(k), is a measure of the size of the scan pattern used in the implantation process. If the index 1 is too large, then the beam map shows a symptom of the scan pattern being underscanned. Conversely, if the index 1 is too small, then the beam map shows a symptom of the scan pattern being overscanned. The index 2, i.e., the difference between the mean of {L(k)} and the mean of {R(k)}, is a measure of the horizontal centering of the scan pattern. If the index 2 is too largely positive, then the beam map shows a symptom of the scan pattern being shifted to the right. Conversely, if the index 2 is too largely negative, then the beam map shows a symptom of the scan pattern being shifted to the left. The index 3, i.e., the value of [variance of {L(k)}+variance of {R(k)}], is a measure of the symmetry of the outmost edge. If the index 3 is too large, then the beam map shows a symptom of the scan pattern being vertically uncentered. The index 4, i.e., [variance of {l(k)}+variance of {r(k)}], is a measure of the symmetry of the minor traces. If the index 4 is too large, then the beam map shows a symptom of the scan pattern having a Y-magnitude failure.

Figure 11B:
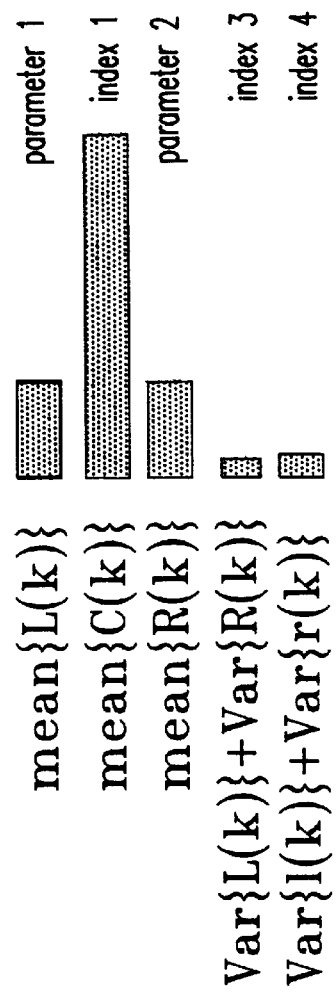
FIG. 11A and 11B are diagrams showing a typical normal beam map and a corresponding histogram of the features generated by the supervision system of FIG. 10A.
Figure 11A:
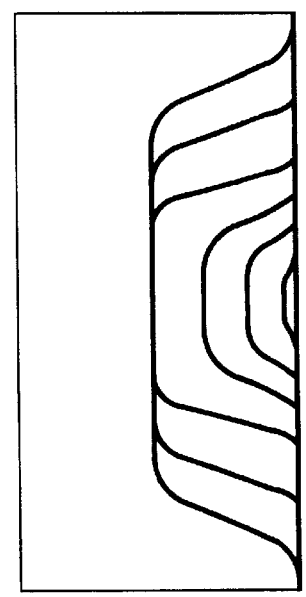

FIG. 11A shows a typical beam map displayed during normal implantation. In FIG. 11B, the indexes 1, 3 and 4 (see Table 2), along with the parameters 1 and 3 (see Table 1) are illustrated by a histogram diagram for the beam map of FIG. 11A. Because the mean {L(k)} and mean {R(k)} are about equal, the index 2 is about zero, thereby indicating that the beam map is horizontally centered. The indexes 3 and 4 are relatively small, indicating that the symmetry of the outmost edges and minors are high.

FIGS. 12A to 12F show beam maps illustrating six symptoms of abnormal ion beam scanning, along with histograms illustrating indexes and parameters corresponding to the ion beam map. In one embodiment of the automatic supervision system 1000 (FIG. 10A), the computer 1002 can be programmed to display these histograms on a display monitor so that the operator 1108 can take corrective actions immediately after being alerted by the alarm 1004.

Figure 12B:
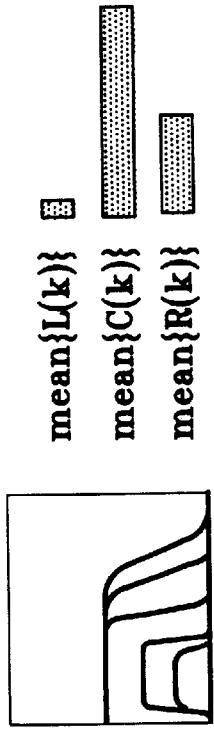
FIGS. 12A to 12F are diagrams showing beam maps of abnormal ion beam scanning and corresponding histograms of the features generated by the supervision system of FIG. 10A.
Figure 12D:
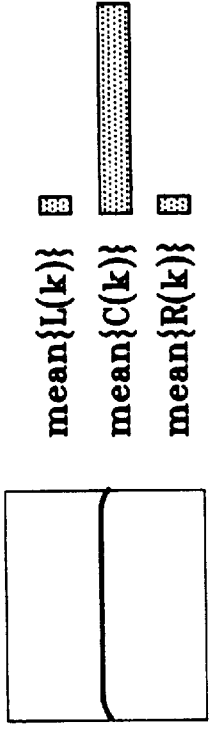
Figure 12F:
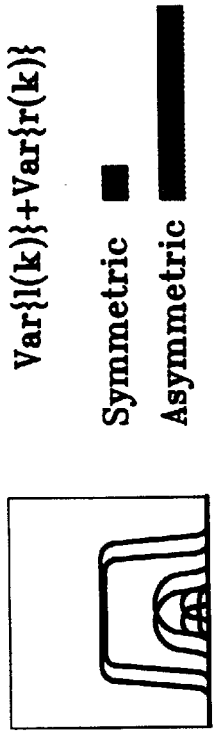
Figure 12A:
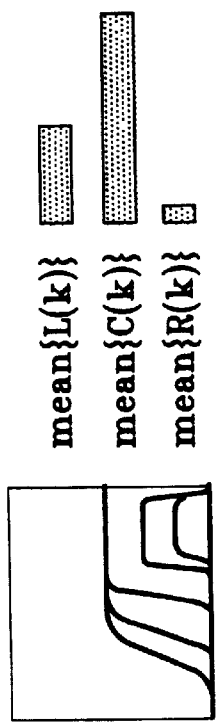
Figure 12C:
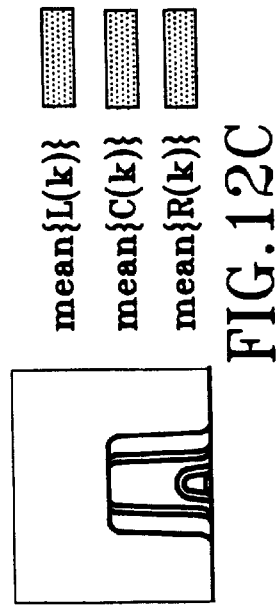
Figure 12E:
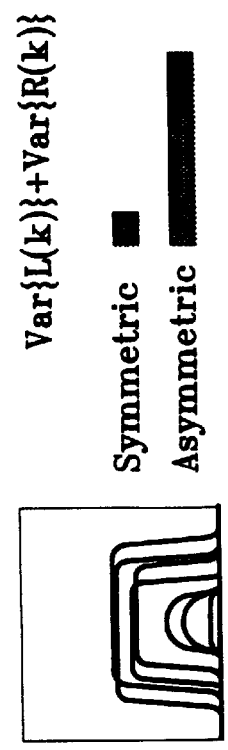

FIG. 12A shows an abnormal center-right scan, which is indicated by the mean {L(k)} being larger than the mean {R(k)}, i.e., the index 2 (Table 2) is beyond a predetermined positive threshold value. This abnormality is detected by the computer 1002, which sends an alarm signal to the alarm 1004 to inform the operator 1008 of the abnormal beam map. Conversely, FIG. 12B shows an abnormal center-left situation, in which the mean {R(k)} is larger than the mean {L(k)}, i.e., the index 2 (Table 2) beyond the predetermined negative threshold value. In an overscanned implantation, as shown in FIG. 12C, the mean {C(k)}, i.e., the index 1 (Table 2), is less than a predetermined threshold value. On the other hand, FIG. 12D shows an underscanned implantation, in which the mean {C(k)} is larger than a predetermined threshold value. Referring to FIG. 12E, an abnormal situation in which the Y-plate voltage is not centered is illustrated. The computer 1002 recognizes this situation when the value of the index 3 (Table 2), i.e., the variance of {L(k)}+ the variance of {R(k)}, exceeds a predetermined threshold range. In FIG. 12F, a Y-magnitude failure is shown. The Y-magnitude failure is identified when the index 4 (Table 2), i.e., the variance of {l(k)}+ the variance of {r(k)}, exceeds a predetermined threshold range. It is appreciated by those skilled in the art, in light of the present disclosure, that other indexes can be defined to identify abnormal beam maps without departing from the spirit of the present invention.

Although specific embodiments, including the preferred embodiment, have been illustrated and described, it will be obvious to those skilled in the art that various modifications may be made without departing from the scope of the invention which is intended to be limited solely by the appended claims. For example, embodiments of the automatic supervision system can be adapted for implanters other than the model NV-6200 A/AV implanter. Also, the implementation of the extraction system of FIG. 9A is not limited to the specific embodiment shown in FIG. 9B. For example, any suitable type of timer may be used to measure the duration of the left, center and right segments. Further, any number of the symptoms can be defined, and the methods of displaying the calculated indexes and parameters are not limited to those shown in FIGS. 11A–12F.

What is claimed is:

1. An ion implantation system with an automatic supervision system for controlling implantation of ions in a semiconductor wafer, the ion implantation system being configured to generate a beam map during ion implantation, the ion implantation system comprising:

implantation means for implanting ions in the semiconductor wafer by repeated scanning of a beam of ions across the wafer;

feature extraction means for extracting information from the beam map generated by the ion implantation system; and data conversion means for converting the information extracted from the beam map into a plurality of indexes, said plurality of indexes being used for detecting abnormal beam scanning by said implantation means.

2. The ion implantation system according to claim 1, wherein said data conversion means comprises means for recognizing a plurality of symptoms corresponding to a plurality of abnormal beam scans.

3. The ion implantation system according to claim 2, wherein said beam map comprises a plurality of frames each having an outmost edge and at least one minor, said outmost edge and said minor each having a width, wherein the width of said outmost edge is larger than the width of said minor.

4. The ion implantation system according to claim 3, wherein, for each frame of said beam map, said information extracted by said feature extraction means comprises magnitudes of:

a first left segment spanning from a beginning point of said outmost edge to a first point at which said outmost edge equals a predetermined threshold;

a first center segment spanning from said first point to a second point at which said outmost edge equals the predetermined threshold; and a first right segment spanning from the second point to an ending point of said outmost edge.

5. The ion implantation system according to claim 4, wherein said information extracted by said feature extraction means further comprises magnitudes of:

a second left segment spanning from a beginning point of said minor to a third point at which said minor equals the predetermined threshold;

a second center segment spanning from the third point to a fourth point at which said minor equals the predetermined threshold; and a second right segment spanning from the fourth point to an ending point of said minor.

6. The ion implantation system according to claim 5, wherein said feature extraction means is coupled to receive a beam current signal and a display blanking signal from said implantation means, said beam map indicative of a beam current along a scan path across the semiconductor wafer.

7. The ion implantation system according to claim 5, wherein said plurality of indexes comprises:

a mean value of the first center segment magnitudes of said plurality of frames of said beam map;

a difference of a mean value of the first left segment magnitudes of a plurality of frames of said beam map and a mean value of the first right segment magnitudes of said plurality of frames of said beam map;

a sum of a variance of the first left segment magnitudes of said plurality of frames and a variance of the first right segment magnitudes of said plurality of frames; and a sum of a variance of the second left segment magnitudes of said plurality of frames and a variance of the second right segment magnitudes of said plurality of frames.

8. The ion implantation system according to claim 7, wherein said plurality of symptoms comprise:

a center-right symptom, wherein the mean value of the first right segment magnitudes is less than the mean value of the first left segment magnitudes beyond a first threshold value;

a center-left symptom, wherein the mean value of the first right segment magnitudes is larger than the mean value of the first left segment magnitudes beyond the first threshold value;

an overscanned symnptom, wherein the mean value of the first center segment magnitudes is less than a second threshold value;

an underscanned symptom, wherein the mean value of the first center segment magnitudes is larger than a third threshold value;

a Y-uncentered symptom, wherein the sum of the variance of the first left segment magnitudes and the variance of the first right segment magnitudes is not in a first threshold range; and a Y-magnitude failure symptom, wherein the sum of the variance of the second left segment magnitudes and the variance of the second right segment magnitudes is not in a second threshold range.

9. The ion implantation system according to claim 8, further comprising alarm means for receiving an alarm signal from said data conversion means and providing an indication that at least one of said plurality of symptoms has occurred, said data conversion means providing said alarm signal when any one or more of said plurality of symptoms is recognized.

10. The ion implantation system according to claim 6, wherein said feature extraction means comprises:

first comparison means for comparing the beam current signal and the beam threshold current to generate a feature signal;

inverting means for generating a logically inverted feature signal in response to the feature signal;

center-segment extraction means for generating a center-segment signal in response to the feature signal and the display blanking signal;

side-segment extraction means for generating a side-segment signal in response to the inverted feature signal and the display blanking signal, wherein said side-segment signal comprises a left-segment signal and a right-segment signal;

first counting means for counting a number of clock cycles that occur during an active period of the center-segment signal; and second counting means for counting a number of clock cycles that occur during active periods of the side-segment signal.

11. The ion implantation system according to claim 10, further comprising second comparison means for buffering and inverting the display blanking signal from said ion implantation means.

12. The ion implantation system according to claim 10, further comprising a buffer having an input lead coupled to said ion implantation means and an output lead coupled to said first comparison means.

13. The ion implantation system according to claim 10, wherein said center-segment extraction means comprises an AND gate.

14. The ion implantation system according to claim 10, wherein said side-segment extraction means comprises an AND gate.

15. The ion implantation system according to claim 10, wherein said first counting means comprises an AND gate having a first input lead coupled to receive a clock signal and a second input lead coupled to receive the center-segment signal.

16. The ion implantation system according to claim 10, wherein said second counting means comprises an AND gate having a first input lead coupled to receive the clock signal and a second input lead coupled to receive the side-segment signal.

17. The ion implantation system according to claim 1, wherein said data conversion means comprises a computer.

18. A feature extraction circuit for use in an automatic supervision system for an ion implanter, said ion implanter providing a beam current signal and a display blanking signal for generating an ion beam map during an ion implantation process, the feature extraction circuit comprising:

a first comparator coupled to receive the beam current signal, wherein said first comparator compares the beam current signal to a first threshold, said first comparator configured to generate at an output lead a feature signal with a first logic level when said beam current signal exceeds said first threshold;

an inverter coupled to said output lead of said first comparator, said inverter configured to generate a logically inverted feature signal in response to the feature signal;

a center-segment extraction circuit having a first input lead coupled to said output lead of said first comparator and having a second input lead coupled to receive the display blanking signal, wherein said center-segment extraction circuit is configured to generate a center-segment signal dependent on a center segment of a beam map;

a side-segment extraction circuit having a first input lead coupled to said output lead of said inverter and having a second input lead coupled to receive the display blanking signal, wherein said side-segment extraction circuit is configured to generate a side-segment signal comprising a left-segment signal dependent on a left segment of the beam map and a right-segment signal dependent on a right segment of the beam map;

a first counter coupled to an output lead of said center-segment extraction circuit, wherein said first counter is configured to count clock cycles occurring during an active period of said center-segment signal; and a second counter coupled to an output lead of said side-segment extraction circuit, wherein said second counter is configured to count clock cycles occurring during an active period of said left-segment signal and during an active period of said right-segment signal.

19. The feature extraction circuit according to claim 18, further comprising second comparator having a first input lead coupled to receive the display blanking signal, wherein said second comparator is configured to invert the display blanking signal.

20. The feature extraction circuit according to claim 18, wherein said center-segment extraction circuit comprises an AND gate having a first input lead and a second input lead respectively coupled to said first and second input leads of said center-segment extraction circuit.

21. The feature extraction circuit according to claim 18, wherein said side-segment extraction circuit comprises an AND gate having a first input lead and a second input lead respectively coupled to said first and second input leads of said side-segment extraction circuit.

22. The feature extraction circuit according to claim 18, wherein said first counter comprises an AND gate having a first input lead coupled to receive said center segment signal and a second input lead coupled to receive a clock signal.

23. The feature extraction circuit according to claim 18, wherein said second counter comprises an AND gate having a first input lead coupled to receive said side-segment signal and a second input lead coupled to receive a clock signal.

24. The feature extraction circuit according to claim 18, wherein said first counter and said second counter each have an output port coupled to a processor, said processor configured to calculate durations of said active periods of said center-segment and side-segment signals.

* * * * *